(12) United States Patent
Miyake

(10) Patent No.: US 10,505,504 B2
(45) Date of Patent: Dec. 10, 2019

(54) CLASS D AMPLIFIER

(71) Applicant: YAMAHA CORPORATION, Hamamatsu-shi (JP)

(72) Inventor: Yoshiro Miyake, Hamamatsu (JP)

(73) Assignee: YAMAHA CORPORATION, Hamamatsu-Shi (JP)

(*) Notice: Subject to any disclaimer, the term of this patent is extended or adjusted under 35 U.S.C. 154(b) by 0 days.

(21) Appl. No.: 15/940,046

(22) Filed: Mar. 29, 2018

(65) Prior Publication Data

US 2018/0226926 A1 Aug. 9, 2018

Related U.S. Application Data

(63) Continuation of application No. PCT/JP2016/079645, filed on Oct. 5, 2016.

(30) Foreign Application Priority Data

Oct. 5, 2015 (JP) .................. 2015-197330

(51) Int. Cl.
*H03F 3/217* (2006.01)
*H03F 3/185* (2006.01)
(Continued)

(52) U.S. Cl.
CPC ......... *H03F 3/2173* (2013.01); *H03F 1/0205* (2013.01); *H03F 1/32* (2013.01);
(Continued)

(58) Field of Classification Search
CPC ................ H03F 3/217; H03F 3/2171
(Continued)

(56) References Cited

U.S. PATENT DOCUMENTS

| | | | |
|---|---|---|---|
| 8,022,756 B2 * | 9/2011 | Walker | H03F 3/217 330/10 |
| 8,144,880 B2 | 3/2012 | Chen et al. | |

(Continued)

FOREIGN PATENT DOCUMENTS

| | | |
|---|---|---|
| JP | H07231226 A | 8/1995 |
| JP | 2005269580 A | 9/2005 |

(Continued)

OTHER PUBLICATIONS

International Search Report issued in Intl. Appln. No. PCT/JP2016/079645 dated Dec. 27, 2016. English translation provided.

(Continued)

*Primary Examiner* — Steven J Mottola
(74) *Attorney, Agent, or Firm* — Rossi, Kimms & McDowell LLP

(57) ABSTRACT

A class D amplifier includes an output stage that performs a switching operation, a feedback circuit that generates a feedback signal based on the output signal output from the output stage, an integration amplifier that outputs an integrated value signal in response to an input signal and the feedback signal, a comparator that compares the integrated value signal with a standard signal, a driver that controls the output stage based on a signal output from the comparator, a carrier signal generator that generates a carrier signal, a reference signal generator that outputs a reference signal indicating a driving amount for a load at the output stage, and a standard signal switch that switches the standard signal to the carrier signal or a standard potential based on whether a level of the reference signal is smaller than a threshold value.

5 Claims, 5 Drawing Sheets

(51) Int. Cl.
*H03F 1/02* (2006.01)
*H03F 1/32* (2006.01)

(52) U.S. Cl.
CPC .......... *H03F 3/185* (2013.01); *H03F 3/2171* (2013.01); *H03F 2200/03* (2013.01); *H03F 2200/351* (2013.01)

(58) Field of Classification Search
USPC .............................................. 330/207 A, 251
See application file for complete search history.

(56) References Cited

U.S. PATENT DOCUMENTS

2006/0001461 A1 1/2006 Tsuji
2006/0012428 A1 1/2006 Ohkuri

FOREIGN PATENT DOCUMENTS

| | | |
|---|---|---|
| JP | 2006020177 A | 1/2006 |
| JP | 2006033499 A | 2/2006 |
| JP | 3129456 U | 2/2007 |
| JP | 2007088926 A | 4/2007 |
| JP | 2012049893 A | 3/2012 |
| JP | 2013207534 A | 10/2013 |

OTHER PUBLICATIONS

Written Opinion issued in Intl. Appln. No. PCT/JP2016/079645 dated Dec. 27, 2016.
English translation of Written Opinion issued in Intl. Appln. No. PCT/JP2016/079645 dated Dec. 27, 2016.
Office Action issued in Japanese Appln. No. 2015-197330 dated Oct. 8, 2019. English machine translation provided.

\* cited by examiner

FIG. 10
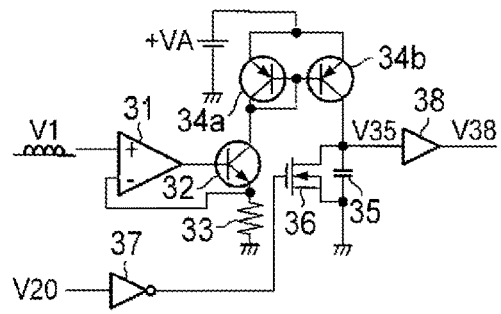
FIG. 11A  V20
FIG. 11B  V35
FIG. 11C  V35
FIG. 11D  V38
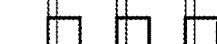
FIG. 12
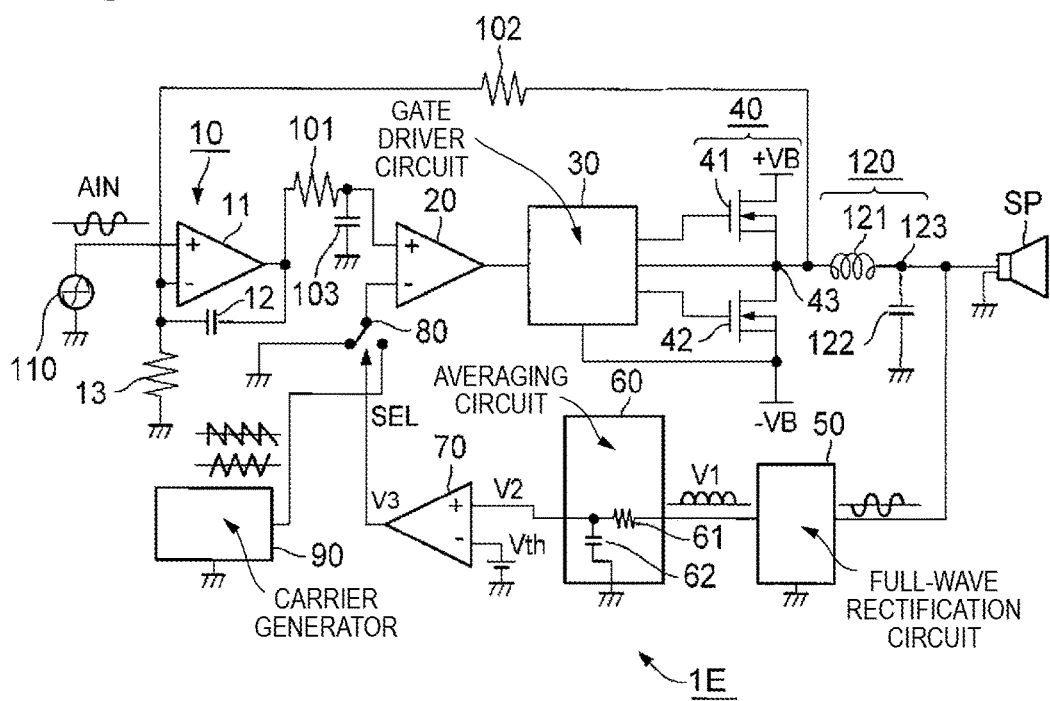

CLASS D AMPLIFIER

CROSS REFERENCE TO RELATED APPLICATIONS

This application is a continuation of PCT application No. PCT/JP2016/079645, which was filed on Oct. 5, 2016 based on Japanese Patent Application (No. 2015-197330) filed on Oct. 5, 2015, the contents of which are incorporated herein by reference.

BACKGROUND OF THE INVENTION

1. Field of the Invention

This disclosure relates to a class D amplifier suitable as a power amplifier for driving a speaker.

2. Description of the Related Art

In recent years, class D amplifiers have come into wide use as power amplifiers for audio use. These class D amplifiers are amplifiers in which output stage transistors are ON/OFF switched by a PWM pulse train that is pulse-width modulated depending on an input audio signal and the current from a power source is supplied to a speaker via these output stage transistors.

These class D amplifiers are available as an amplifier being configured so as to generate the above-mentioned PWM pulse train by using the carrier signal generated by a carrier generator and as an amplifier being configured so as to generate the above-mentioned PWM pulse train by self-excited oscillation. Hereafter, the former amplifier is referred to as a separately-excited class D amplifier and the latter amplifier is referred to as a self-excited class D amplifier for the sake of convenience.

JP-UM-B-3129456 discloses a class D amplifier capable of performing switching between the operation as a self-excited class D amplifier and the operation as a separately-excited class D amplifier. JP-UM-B-3129456, however, does not disclose at all a standard according to which the switching between the operation as a self-excited class D amplifier and the operation as a separately-excited class D amplifier is performed. Hence, JP-UM-B-3129456 does not disclose how the advantages of both the self-excited class D amplifier and the separately-excited class D amplifier are attained.

Furthermore, for the purpose of suppressing the occurrence of a beat, JP-A-2005-269580 discloses a technology for operating a self-excited class D amplifier in synchronization with the output signal of an external oscillator. In JP-A-2005-269580, however, switching operation at a fixed frequency similar to that of a separately-excited class D amplifier is performed by the self-excited class D amplifier, whereby JP-A-2005-269580 does not provide a technology for attaining the advantages of both the self-excited class D amplifier and the separately-excited class D amplifier.

Since the feedback amount of the self-excited class D amplifier is higher than that of the separately-excited class D amplifier, audio performance can be enhanced by reducing the distortion rate. Moreover, since the oscillation frequency of the self-excited class D amplifier lowers at the time of large output, the self-excited class D amplifier is advantageous in that the switching loss lowers and the efficiency rises. However, when the self-excited class D amplifiers for a plurality of channels are operated simultaneously, the difference components due to the individual differences in the oscillation frequencies of the respective amplifiers cause the occurrence of a beat. At the time of no signal or small output, since the oscillation frequency of the self-excited oscillation of the self-excited class D amplifier does not change, this beat is easily audible and is liable to become a problem. At the time of large output, however, since the frequency of the beat changes and the beat is hardly audible, the beat does not become a big problem. On the other hand, although the separately-excited class D amplifier generates no beat, since the amplifier performs, at the time of large output, switching operation at a fixed frequency similar to that at the time of no signal or small output, the amplifier is large in switching loss and low in efficiency in comparison with the self-excited class D amplifier. Hence, the separately-excited class D amplifier is not suitable as a large output amplifier. Still further, since the separately-excited class D amplifier has a small feedback amount, enhancing audio performance by lowering the distortion rate is difficult.

SUMMARY OF THE INVENTION

This disclosure is made in consideration of the above-mentioned circumstances and is intended to provide a class D amplifier in which the advantages of both the self-excited class D amplifier and the separately-excited class D amplifier are attained.

This disclosure provides a class D amplifier includes an output stage configured to perform a switching operation, a feedback circuit configured to generate a feedback signal based on the output signal output from the output stage, an integration amplifier configured to output an integrated value signal in response to an input signal and the feedback signal, a comparator configured to compare the integrated value signal with a standard signal, a driver configured to control the output stage based on a signal output from the comparator, a carrier signal generator configured to generate a carrier signal having a predetermined frequency, a reference signal generator configured to output a reference signal indicating a driving amount for a load at the output stage, and a standard signal switch configured to switch the standard signal to the carrier signal or a standard potential based on whether a level of the reference signal is smaller than a threshold value.

With this disclosure, in the case that the level of the reference signal indicating the driving amount for the load at the output stage is smaller than the threshold value, the carrier signal is supplied to the comparator as the standard signal, whereby the class D amplifier operates as a separately-excited class D amplifier. On the other hand, in the case that the level of the reference signal is the threshold value or more, a predetermined standard potential is supplied to the comparator as a standard signal, whereby the class D amplifier operates as a self-excited class D amplifier. Hence, with this disclosure, the class D amplifier operates as a separately-excited class D amplifier at the time of no signal or small output, thereby being capable of preventing the occurrence of a beat, and operates as a self-excited class D amplifier at the time of large output, thereby being capable of reducing switching loss and improving efficiency by lowering the oscillation frequency and being capable of enhancing audio performance by reducing the distortion rate.

BRIEF DESCRIPTION OF THE DRAWINGS

FIG. 10 is a circuit diagram showing a configuration of a part of a dead time control circuit in the same embodiment;

FIGS. 11A to 11D are waveform diagrams explaining operations for dead time control in the same embodiment; and FIG. 12 is a circuit diagram showing a configuration of a modification in which the position of the first-order integrator inside the feedback circuit in the above-mentioned first embodiment is moved.

DETAILED DESCRIPTION OF THE EXEMPLARY EMBODIMENTS

Figure 1:
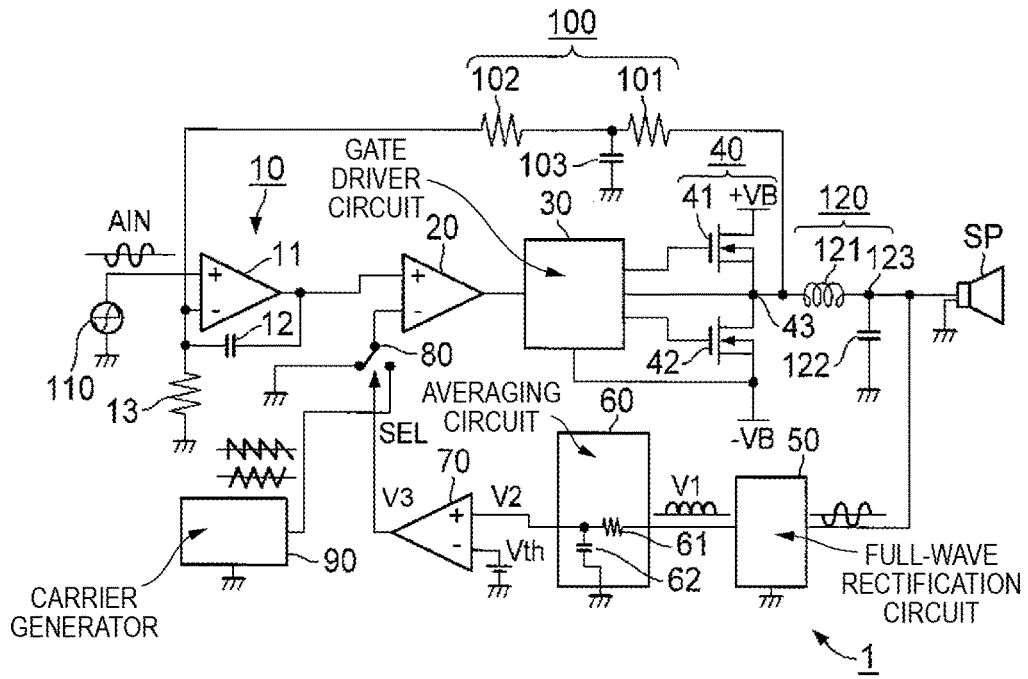
FIG. 1 is a circuit diagram showing a configuration of a class D amplifier according to a first embodiment of this disclosure.

Embodiments of this disclosure will be described below referring to the drawings.

First Embodiment

FIG. 1 is a circuit diagram showing a configuration of a class D amplifier 1 according to a first embodiment of this disclosure. In FIG. 1, a speaker SP serving as the load of the class D amplifier 1 and a filter 120 interposed between the class D amplifier 1 and the speaker SP are also shown to facilitate the understanding of the configuration of the class D amplifier 1.

As shown in FIG. 1, the class D amplifier 1 has an integration amplifier 10, a comparator 20, a gate driver circuit 30, an output stage 40, a full-wave rectification circuit 50, an averaging circuit 60, a comparator 70, a switch 80, a carrier generator 90, and a feedback circuit 100.

The integration amplifier 10 has an operational amplifier 11, a capacitor 12, and a resistor 13. The input audio signal AIN from an audio signal source 110 is given to the non-inverting input terminal (plus input terminal) of the operational amplifier 11. An integrating capacitor 12 is interposed between the output terminal and the inverting input terminal (minus input terminal) of the operational amplifier 11. Furthermore, the resistor 13 is interposed between the inverting input terminal of the operational amplifier 11 and a grounding wire. Moreover, in the class D amplifier 1, the signal of the output node 43 of the output stage 40 passes through the feedback circuit 100, thereby being supplied to the inverting input terminal of the operational amplifier 11 as a feedback signal.

In this integration amplifier 10, the difference between the input audio signal AIN and this feedback signal is integrated, and the voltage corresponding to the integrated value is charged to the capacitor 12. After that, the integration amplifier 10 outputs an integrated value signal indicating this integrated value.

The comparator 20 compares the integrated value signal output from the integration amplifier 10 with the standard signal selected by the switch 80 to output a pulse signal. The details of the standard signal and the selection of the standard signal by the switch 80 will be described later.

The gate driver circuit 30 drives the output stage 40 depending on the pulse signal output from the comparator 20. The output stage 40 has transistors 41 and 42. In this example, the transistors 41 and 42 are N-channel MOS FETs (Metal Oxide Semiconductor Field Effect Transistors). The transistor 41 is herein a high-side switching device in which its drain is connected to a positive power source +VB and its source and P-well (a low-density P-type impurity layer in which the source and drain of the transistor 41 are formed) are connected to the output node 43 of the output stage 40. Furthermore, the transistor 42 is a low-side switching device in which its drain is connected to the output node 43 and its source and P-well (a low-density P-type impurity layer in which the source and drain of the transistor 42 are formed) are connected to a negative power source −VB. Depending on the pulse signal output from the comparator 20, the gate driver circuit 30 outputs a gate signal for ON/OFF controlling the transistor 41 between the gate of the transistor 41 and the output node 43 and outputs a gate signal for ON/OFF controlling the transistor 42 between the gate of the transistor 42 and the negative power source −VB.

Under the drive control by the gate driver circuit 30, the output stage 40 turns ON the transistor 41 and turns OFF the transistor 42, thereby connecting the positive power source +VB to the output node 43, or turns OFF the transistor 41 and turns ON the transistor 42, thereby connecting the negative power source −VB to the output node 43. Hence, the waveform of the signal of the output node 43 of the output stage 40 becomes a rectangular wave.

The filter 120 is a low-pass filter that is used to eliminate high-frequency components higher than the audio band from the output signal of the output node 43 and to supply the frequency components of the remaining audio band of the output signal of the output node 43 to the speaker SP. This filter 120 has an inductor 121 and a capacitor 122. The inductor 121 is herein interposed between the output node 43 of the output stage 40 and one terminal of the speaker SP. Furthermore, one terminal of the capacitor 122 is connected to the node 123 between the inductor 121 and the speaker SP, and the other terminal thereof is grounded.

The feedback circuit 100 has resistors 101 and 102 interposed in series between the output node 43 of the output stage 40 and the inverting input terminal of the operational amplifier 11 and a capacitor 103 interposed between the common connection point of these resistors 101 and 102 and the grounding wire.

The carrier generator 90 is a circuit for generating a carrier signal having a predetermined frequency. The carrier signal may be a sawtooth wave signal or a triangular wave signal.

The full-wave rectification circuit 50 and the averaging circuit 60 constitute a reference signal generator for outputting a reference signal V2 indicating the driving amount for the load at the output stage 40.

More specifically, the full-wave rectification circuit 50 full-wave rectifies the AC voltage to be supplied to the speaker SP and outputs a full-wave rectified voltage V1. The averaging circuit 60 has a resistor 61 interposed between the output terminal of the full-wave rectification circuit 50 and the non-inverting input terminal of the comparator 70 and a capacitor 62 interposed between the terminal section of the resistor 61 on the side of the comparator 70 and the grounding wire. The averaging circuit 60 is a time constant circuit for making the full-wave rectified voltage V1 uniform on a time axis and for outputting the obtained voltage as a DC voltage. As described above, the full-wave rectification circuit 50 according to this embodiment outputs the reference signal V2 on the basis of the AC voltage to be supplied to the speaker SP.

What's more, the comparator 70 and the switch 80 constitute a standard signal switch for switching the standard signal to be supplied to the inverting input terminal of the comparator 20 to the carrier signal output from the carrier generator 90 or to a standard potential, more explicitly, the ground potential of the grounding wire.

Still more specifically, a predetermined threshold voltage Vth is given to the inverting input terminal of the comparator 70. The comparator 70 supplies a selection signal SEL, whose voltage level V3 is a Low level (L level), to the switch 80 in the case that the reference signal V2 output from the averaging circuit 60 is smaller than the threshold voltage Vth, and the comparator 70 supplies a selection signal SEL, whose voltage level V3 is a High level (H level), to the switch 80 in the case that the reference signal V2 is the threshold voltage Vth or more. The switch 80 selects the carrier signal generated by the carrier generator 90 as the standard signal in the case that the selection signal SEL has the L level and selects the ground potential of the grounding wire as the standard signal in the case that the selection signal SEL has the H level, and then supplies the selected standard signal to the inverting input terminal of the comparator 20.

The above is the configuration of the class D amplifier 1 according to this embodiment.

Next, the operation of this embodiment will be described. In this embodiment, the averaging circuit 60 outputs a DC voltage corresponding to the average value of the full-wave rectified voltage V1 of the AC voltage to be given to the speaker SP as the reference signal V2. When the AC voltage output to the speaker SP generates no sound or generates small output, the reference signal V2 is smaller than the threshold voltage Vth, and the voltage level V3 of the selection signal SEL becomes the L level. Hence, the carrier signal output from the carrier generator 90 is selected by the switch 80 and supplied to the inverting input terminal of the comparator 20 as the standard signal.

In the state in which the carrier signal of the carrier generator 90 is supplied to the inverting input terminal of the comparator 20, the class D amplifier 1 functions as a separately-excited class D amplifier as described later.

First, the integration amplifier 10 integrates the difference between the input audio signal AIN and the feedback signal fed back from the output stage 40 via the feedback circuit 100 and outputs an integrated value signal indicating the integrated value. The comparator 20 compares this integrated value signal with the carrier signal from the carrier generator 90 and outputs, for example, a pulse signal having an H level during a period when the signal value of the integrated value signal is higher than the signal value of the carrier signal and having an L level during the other periods.

In response to the change of the pulse signal output from the comparator 20 from the L level to the H level, the gate driver circuit 30 turns OFF the transistor 42 of the output stage 40 and then turns ON the transistor 41 of the output stage 40. Furthermore, in response to the change of the pulse signal output from the comparator 20 from the H level to the L level, the gate driver circuit 30 turns OFF the transistor 41 of the output stage 40 and then turns ON the transistor 42 of the output stage 40.

As a result, a rectangular wave signal is output from the output stage 40 to the output node 43. Since this rectangular wave signal passes through the filter 120, signal components having frequencies over the audible frequency band are eliminated, whereby the rectangular wave signal becomes an audible frequency band signal and is supplied to the speaker SP.

On the other hand, since the rectangular wave signal output from the output stage 40 to the output node 43 passes through the feedback circuit 100, the high-frequency components of the signal are eliminated, and the feedback signal from which the high-frequency components are eliminated is negatively fed back to the inverting input terminal of the operational amplifier 11 of the integration amplifier 10.

When the level of the input audio signal AIN lowers relatively in comparison with the level of the feedback signal, the level of the integrated value signal output from the integration amplifier 10 lowers. As a result, the duty ratio of the pulse signal output from the comparator 20 lowers, and the duty ratio of the rectangular wave signal output from the output stage 40 to the output node 43 lowers, whereby the level of the feedback signal lowers.

On the other hand, when the level of the input audio signal AIN rises relatively in comparison with the level of the feedback signal, the level of the integrated value signal output from the integration amplifier 10 rises. As a result, the duty ratio of the pulse signal output from the comparator 20 rises, and the duty ratio of the rectangular wave signal output from the output stage 40 to the output node 43 rises, whereby the level of the feedback signal rises.

As a result that the above-mentioned negative feedback control is performed, the waveform of the drive signal to be given from the output stage 40 to the speaker SP via the filter 120 corresponds to the waveform of the input audio signal AIN.

The above explanation describes the operation of the class D amplifier 1 at the time of no sound generation or small signal output.

Next, the operation of the class D amplifier 1 in the case that the amplitude of the output signal has increased will be explained. When the amplitude of the signal to be output to the speaker SP has increased and the reference signal V2 output by the averaging circuit 60 becomes the threshold voltage Vth or more, the voltage level V3 of the selection signal SEL becomes the H level. Hence, the ground potential of the grounding wire is selected by the switch 80 and then supplied to the inverting input terminal of the comparator 20 as the standard signal. In this embodiment, in the state in which the inverting input terminal of the comparator 20 is grounded as described above, the amplitude characteristics and the phase characteristics of the feedback circuit 100 are designed so as to satisfy the oscillation conditions in the gain of the loop having the integration amplifier 10, the comparator 20, the gate driver circuit 30, the output stage 40 and the feedback circuit 100. In the state in which this self-excited oscillation occurs, the class D amplifier 1 functions as a self-excited class D amplifier as described below.

In a manner similar to that described above, the signal output from the output stage 40 to the output node 43 becomes a rectangular wave signal. In the feedback circuit 100, the first-order integration of this rectangular wave signal is performed by a first-order integrator having the resistor 101 and the capacitor 103. Hence, the waveform of the charging voltage of the capacitor 103 becomes a triangular wave. This triangular wave is supplied to the inverting input terminal of the operational amplifier 11 of the integration amplifier 10 via the resistor 102 as a feedback signal. The operational amplifier 11 raises the output signal when the signal value of the input audio signal AIN becomes higher than the signal value of the triangular wave that is fed back via the resistor 102, and causes the output signal to fall when the signal value becomes lower. Since the output signal of the operational amplifier 11 passes through the comparator 20, the inverting input terminal of which is grounded, the output signal becomes a rectangular wave signal and is input to the gate driver circuit 30. The signal input to the gate driver circuit 30 becomes a PWM pulse train that is pulse-width modulated by the input audio signal AIN.

In a manner similar to that described above, in response to the level change of the pulse signal output from the comparator 20, the gate driver circuit 30 alternately turns ON and OFF the transistors 41 and 42 of the output stage 40. As a result, a rectangular wave signal is output from the output stage 40 to the output node 43. Since this rectangular wave signal passes through the filter 120, signal components having frequencies over the audible frequency band are eliminated, whereby the rectangular wave signal becomes an audible frequency band signal and is supplied to the speaker SP.

Moreover, since the rectangular wave signal output from the output stage 40 to the output node 43 passes through the feedback circuit 100, the signal becomes a feedback signal, that is, a triangular wave signal, and the feedback signal is supplied to the inverting input terminal of the operational amplifier 11 of the integration amplifier 10. After that, the operation similar to that described above will be repeated.

The above is the operation of this embodiment.

In this embodiment, the class D amplifier 1 operates as a separately-excited class D amplifier at the time of no signal or small output. Hence, when the class D amplifiers 1 for a plurality of channels are operated simultaneously, since the frequencies of the carrier signals of the respective class D amplifiers 1 coincide with each other, the occurrence of a beat can be suppressed. Furthermore, in this embodiment, at the time when the output is more than small output, the class D amplifier 1 operates as a self-excited class D amplifier, and by the operation of the amplifier operating as the self-excited class D amplifier, its switching loss can be reduced and its efficiency can be improved by lowering the oscillation frequency, and its audio performance can be enhanced by reducing the distortion rate.

Second Embodiment

Figure 2:
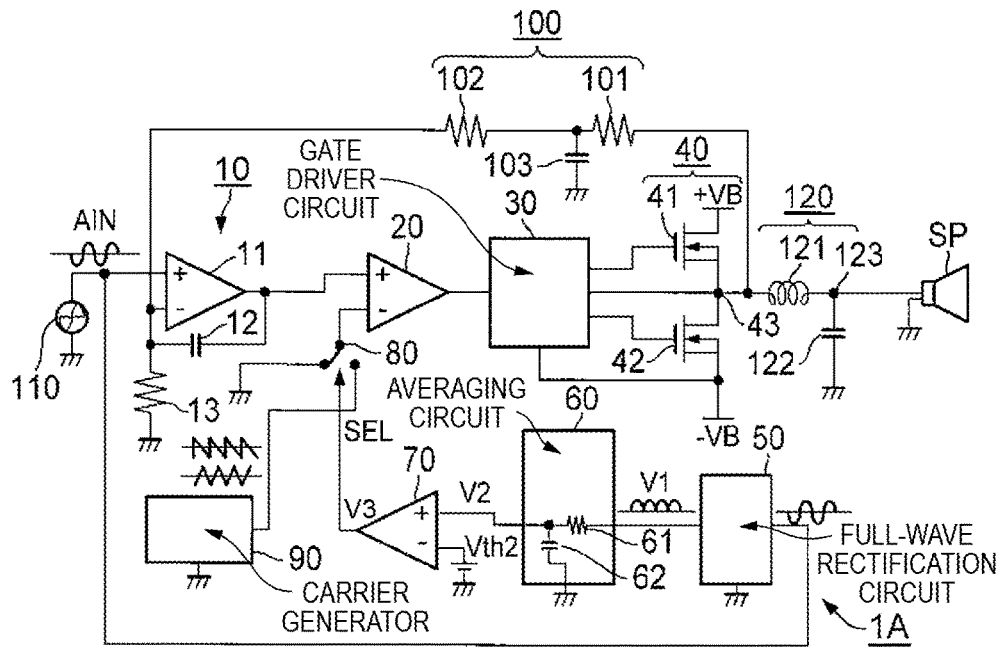
FIG. 2 is a circuit diagram showing a configuration of a class D amplifier according to a second embodiment of this disclosure.

FIG. 2 is a circuit diagram showing a configuration of a class D amplifier 1A according to a second embodiment of this disclosure. In the above-mentioned first embodiment, the reference signal generator having the full-wave rectification circuit 50 and the averaging circuit 60 generates the reference signal V2 on the basis of the drive signal for the speaker SP. On the other hand, in the class D amplifier 1A according to this embodiment, the reference signal generator having the full-wave rectification circuit 50 and the averaging circuit 60 generates the reference signal V2 on the basis of the input audio signal AIN. This is because the level of the drive signal for the speaker SP depends on the level of the input audio signal AIN. This embodiment is different from the above-mentioned first embodiment in this respect.

In this embodiment, the averaging circuit 60 outputs a DC voltage corresponding to the average value of the full-wave rectified voltage V1 of the input audio signal AIN. Since the output voltage of the averaging circuit 60 becomes smaller than a threshold voltage Vth2 at the time of no sound generation or small output, the voltage level V3 of the selection signal SEL becomes the L level, and the class D amplifier 1A operates as a separately-excited class D amplifier. At the time when the output is more than small output, since the output voltage of the averaging circuit 60 becomes the threshold voltage Vth2 or more, the voltage level V3 of the selection signal SEL becomes the H level, and the class D amplifier 1A operates as a self-excited class D amplifier.

Also in this embodiment, advantages similar to those in the above-mentioned first embodiment are obtained.

Third Embodiment

Figure 3:
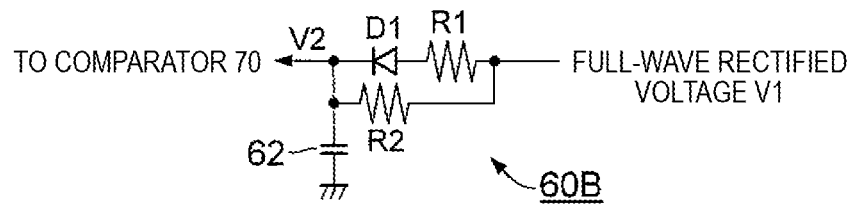
FIG. 3 is a circuit diagram showing a configuration of an averaging circuit in a class D amplifier according to a third embodiment of this disclosure.

Next, a third embodiment of this disclosure will be described. In this embodiment, the averaging circuit 60 in the above-mentioned first or second embodiment is replaced with an averaging circuit 60B shown in FIG. 3. This averaging circuit 60B is configured such that the resistor 61 of the averaging circuit 60 (see FIGS. 1 and 2) is replaced with a circuit having a diode D1, a resistor R1 and a resistor R2. As shown in FIG. 3, one terminal of the resistor R1 and one terminal of the resistor R2 are commonly connected, and the full-wave rectified voltage V1 from the full-wave rectification circuit 50 (see FIGS. 1 and 2) is given to this common connection point. The other terminal of the resistor R1 is connected to the anode of the diode D1, and the cathode of the diode D1 and the other terminal of the resistor R2 are commonly connected to an electrode of the capacitor 62 connected to the comparator 70.

In FIG. 3, in the case that the full-wave rectified voltage V1 is higher than the output voltage V2 of the averaging circuit 60B, a charging current flows from the full-wave rectification circuit 50 to the capacitor 62 via the combined resistor obtained by connecting the resistor R1 and resistor R2 in parallel, and the output voltage V2 of the averaging circuit 60B rises. On the other hand, in the case that the full-wave rectified voltage V1 is lower than the output voltage V2 of the averaging circuit 60B, a discharging current flows from the capacitor 62 to the full-wave rectification circuit 50 via the resistor R2, and the output voltage V2 of the averaging circuit 60B falls. Hence, in this embodiment, the followability (rising time constant) of the output voltage V2 of the averaging circuit 60B at the rising time of the full-wave rectified voltage V1 can be adjusted by adjusting the resistance value of the resistor R1.

Figure 4:
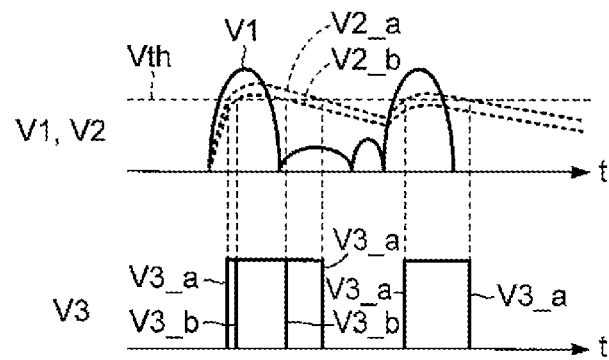
FIG. 4 is a waveform diagram showing the operation of the same embodiment.

FIG. 4 is a waveform diagram showing an example of the operation of this embodiment. In FIG. 4, the horizontal axis represents time t, and the vertical axis represents voltage. The upper side of FIG. 4 exemplifies the waveform of the full-wave rectified voltage V1, the waveform of the output voltage $V2\_a$ of the averaging circuit 60B in the case that the resistor R1 has a predetermined value $R1a$ and the waveform of the output voltage $V2\_b$ of the averaging circuit 60B in the case that the resistor R1 has a value $R1b$ larger than the predetermined value $R1a$.

As exemplified in this figure, in the case that the resistance value of the resistor R1 is $R1a$, the output voltage $V2\_a$ of the averaging circuit 60B rises with a large gradient close to the rising gradient of the full-wave rectified voltage V1 and then lowers with a gradient determined by the resistance value of the resistor R2. On the other hand, in the case that the resistance value of the resistor R1 is $R1b$ (>R1*a*), the output voltage V2_*b* of the averaging circuit 60B rises with a gradient smaller than the rising gradient of the output voltage V2_*a* and then lowers with the gradient determined by the resistance value of the resistor R2. Furthermore, the peak value at the rising time of the output voltage V2_*b* becomes lower than the peak value at the rising time of the output voltage V2_*a*.

The lower side of FIG. 4 exemplifies the waveforms of the output voltages V3_*a* and V3_*b* of the comparator 70 generated depending on the output voltages V2_*a* and V2_*b* of the averaging circuit 60B, respectively. FIG. 4 shows four mountains in the waveform of the full-wave rectified voltage V1. In addition, the output voltage V2_*a* having risen following the first mountain exceeds the threshold voltage Vth. While the output voltage V2_*a* exceeds the threshold voltage Vth, the output voltage V3_*a* of the comparator 70 has an H level. In the example shown in FIG. 4, the voltage V2_*b* having risen following the first mountain also exceeds the threshold voltage Vth. However, the rising gradient of the output voltage V2_*b* is smaller than the rising gradient of the output voltage V2_*a*. Hence, the rising timing of the output voltage V3_*b* of the comparator 70 is more delayed than the rising timing of the output voltage V3_*a*. Moreover, the peak value at the rising timing of the output voltage V2_*b* is lower than the peak value at the rising timing of the output voltage V2_*a*. Hence, the falling timing of the output voltage V3_*b* of the comparator 70 becomes earlier than the falling timing of the output voltage V3_*a*.

In the example shown in FIG. 4, the output voltage V2_*a* having risen following the fourth mountain also exceeds the threshold voltage Vth. Hence, while the output voltage V2_*a* exceeds the threshold voltage Vth, the output voltage V3_*a* of the comparator 70 has an H level. However, in the example shown in FIG. 4, the voltage V2_*b* having risen following the fourth mountain does not exceed the threshold voltage Vth. Hence, the output voltage V3_*b* of the comparator 70 does not have an H level.

As described above, in the case that the averaging circuit 60B shown in FIG. 3 is adopted, the response characteristics in the time region of the output voltage V3 of the comparator 70 can be adjusted with respect to the rising of the full-wave rectified voltage V1 by adjusting the resistance values of the resistors R1 and R2.

For example, in the case that the resistance value of the resistor R1 is made smaller and the resistance value of the resistor R2 is made larger, it is possible to attain a class D amplifier giving priority to self-excited oscillation, wherein the class D amplifier is switched from the separately-excited class D amplifier to the self-excited class D amplifier by sensitively responding to the rising of the full-wave rectified voltage V1, and once the class D amplifier is switched to the self-excited class D amplifier, the class D amplifier hardly returns to the separately-excited class D amplifier. This kind of self-excited oscillation priority type class D amplifier is suitable for a large output amplifier for continuously reproducing rock music at a large sound volume, for example.

On the other hand, in the case that the resistance values of both the resistors R1 and R2 are made larger, it is possible to attain a class D amplifier giving priority to separately-excited oscillation. This kind of separately-excited oscillation priority class D amplifier can prevent a problem in which the separately-excited class D amplifier is switched to the self-excited class D amplifier by a small increase in output sound volume, thereby being suitable for a case in which pianissimo performance in classical music is reproduced continuously Fourth Embodiment Next, a fourth embodiment of this disclosure will be described. In this embodiment, the averaging circuit 60 in the above-mentioned first or second embodiment is replaced with an averaging circuit 60C shown in FIG. 5. This averaging circuit 60C is configured such that a diode D2 is added to the averaging circuit 60B (see FIG. 3) of the above-mentioned third embodiment. The anode of this diode D2 is connected to one terminal of the resistor R2 and the cathode thereof and one terminal of the resistor R1 are connected to the output terminal of the full-wave rectification circuit 50 (see FIGS. 1 and 2).

Figure 5:
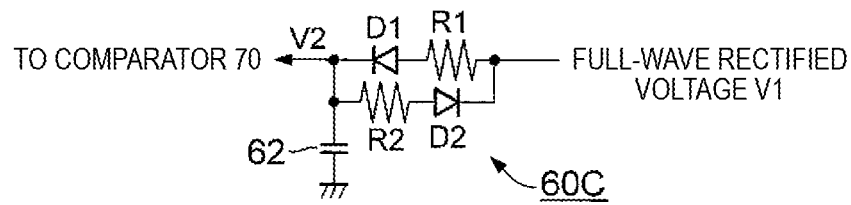
FIG. 5 is a circuit diagram showing a configuration of an averaging circuit in a class D amplifier according to a fourth embodiment of this disclosure.

In FIG. 5, in the case that the full-wave rectified voltage V1 is higher than the output voltage V2 of the averaging circuit 60C, a charging current flows from the full-wave rectification circuit 50 to the capacitor 62 via the resistor R1 and the output voltage V2 of the averaging circuit 60C rises. On the other hand, in the case that the full-wave rectified voltage V1 is lower than the output voltage V2 of the averaging circuit 60C, a discharging current flows to the full-wave rectification circuit 50 via the resistor R2 from the capacitor 62 and the output voltage V2 of the averaging circuit 60C falls. Hence, in this embodiment, the followability (rising time constant) of the output voltage V2 of the averaging circuit 60C at the rising time of the full-wave rectified voltage V1 can be adjusted by adjusting the resistance value of the resistor R1, and the followability (falling time constant) of the output voltage V2 of the averaging circuit 60C at the falling time of the full-wave rectified voltage V1 can be adjusted by adjusting the resistance value of the resistor R2.

Figure 6:
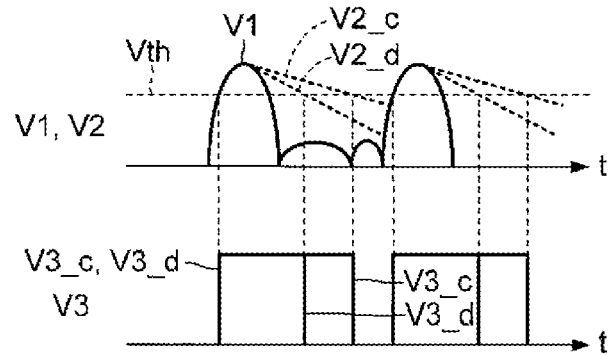
FIG. 6 is a waveform diagram showing the operation of the same embodiment.

FIG. 6 is a waveform diagram showing an example of the operation of this embodiment. In FIG. 6, the horizontal axis represents time t, and the vertical axis represents voltage. The upper side of FIG. 6 exemplifies the waveform of the full-wave rectified voltage V1, the waveform of the output voltage V2_*c* of the averaging circuit 60C in the case that the resistor R2 has a predetermined value R2*c* and the waveform of the output voltage V2_*d* of the averaging circuit 60C in the case that the resistor R2 has a value R2*d* smaller than the predetermined value R2*c*. In this example, the resistance value of the resistor R1 is sufficiently small, and the output voltages V2_*c* and V2_*d* of the averaging circuit 60C rise to the peak value of the full-wave rectified voltage V1 following the rising of the full-wave rectified voltage V1.

As exemplified in the upper side of FIG. 6, in the case that the resistance value of the resistor R2 is R2*c*, the output voltage V2_*c* of the averaging circuit 60C rises to the peak value and then lowers at a gentle gradient. On the other hand, in the case that the resistance value of the resistor R2 is R2*d* (<R2*c*), the output voltage V2_*d* of the averaging circuit 60C lowers at a gradient larger than the falling gradient of the output voltage V2_*c*.

The lower side of FIG. 6 exemplifies the waveforms of the output voltages V3_*c* and V3_*d* of the comparator 70 generated depending on the output voltages V2_*c* and V2_*d* of the averaging circuit 60C, respectively. In the example shown in FIG. 6, both the output voltage V2_*c* and V2_*d* having risen following the first mountain exceeds the threshold voltage Vth. However, the falling gradient of the output voltage V2_*d* is larger than the falling gradient of the output voltage V2_*c*. Hence, the falling timing of the output voltage V3_*d* of the comparator 70 becomes earlier than the falling timing of the output voltage V3_*c*.

As described above, with this embodiment, the response characteristics of the output voltage V3 of the comparator 70 with respect to the falling of the full-wave rectified voltage V1 can be adjusted by adjusting the resistance value of the resistor R2. Moreover, with this embodiment, the response characteristics of the output voltage V3 of the comparator 70 with respect to the rising of the full-wave rectified voltage V1 can be adjusted by adjusting the resistance value of the resistor R1, although this adjustment is not shown in the figure because the adjustment is similar to that described in the above-mentioned third embodiment.

Fifth Embodiment

Figure 7:
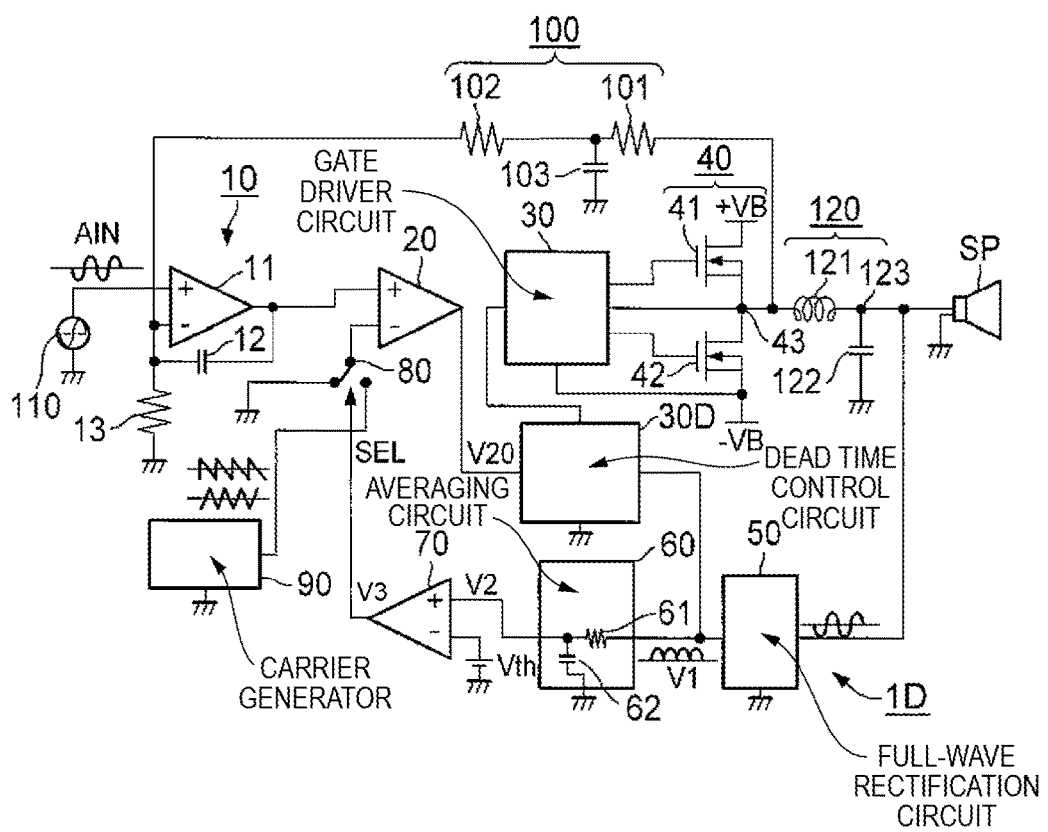
FIG. 7 is a circuit diagram showing a configuration of a class D amplifier according to a fifth embodiment of this disclosure.

FIG. 7 is a circuit diagram showing a configuration of a class D amplifier 1D according to a fifth embodiment of this disclosure. The class D amplifier 1D according to the fifth embodiment is configured such that a dead-time control circuit 30D is added to the class D amplifier 1 of the above-mentioned first embodiment. In the example shown in FIG. 7, although the dead-time control circuit 30D is added to the class D amplifier 1 of the first embodiment, the dead-time control circuit 30D may also be added to the class D amplifier 1A of the above-mentioned second embodiment, the class D amplifier of the above-mentioned third embodiment or the class D amplifier of the above-mentioned fourth embodiment.

In each of the respective embodiments, in the case that the state in which one of the high-side transistor 41 and the low-side transistor 42 is ON and the other is OFF is transited to the state in which the one is OFF and the other is ON, this state transition is performed by the gate driver circuit 30 such that a dead time during which both the transistors are turned OFF is interposed between the states. The gate driver circuit 30D in this embodiment is a circuit for controlling this dead time on the basis of the output voltage (full-wave rectified voltage) V1 of the full-wave rectification circuit 50. The reason why this kind of dead time control circuit 30D is provided will be described below.

FIGS. 8A to 8D exemplify currents that flow to respective sections by the switching operation of the output stage 40. FIGS. 8A to 8D show a parasitic capacitance 41C interposed between the source and drain of the transistor 41 and a parasitic capacitance 42C interposed between the source and drain of the transistor 42, although the parasitic capacitances are not shown in FIG. 7.

Figure 8A:
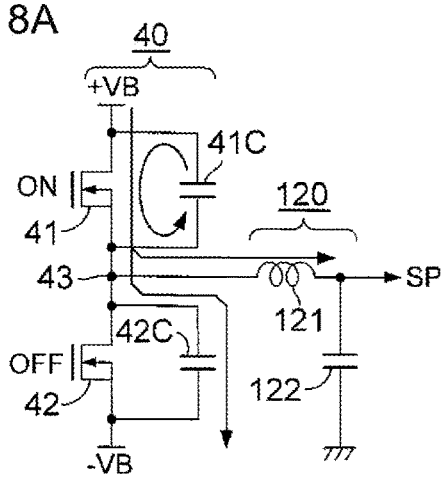
FIGS. 8A to 8D are circuit diagrams showing the currents flowing in the respective sections of the output stage in the same embodiment.
Figure 8B:
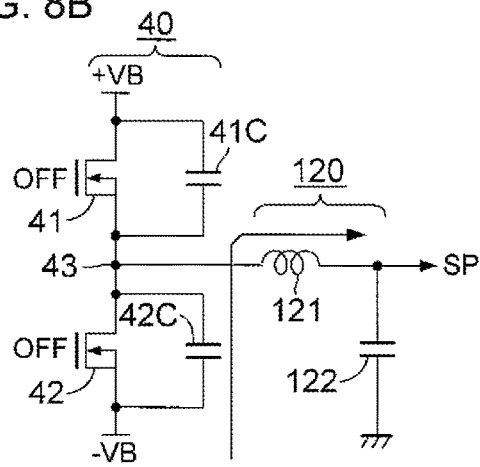
Figure 8C:
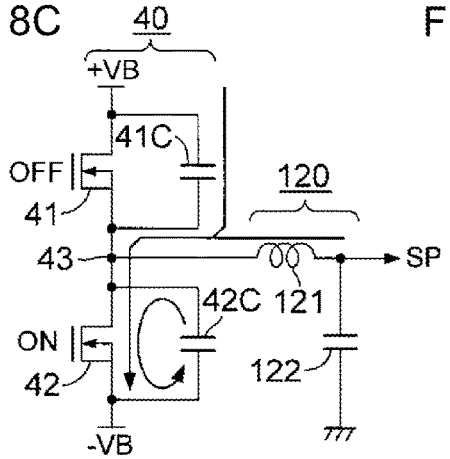
Figure 8D:
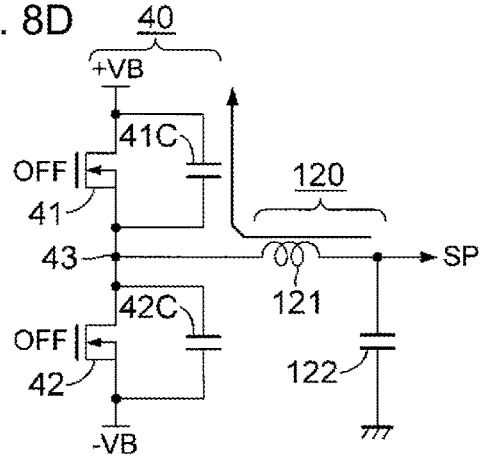

The output stage 40 sequentially repeats the following states: the state in which the transistor 41 is ON and the transistor 42 is OFF as shown in FIG. 8A, the state in which the transistor 41 is OFF and the transistor 42 is OFF as shown in FIG. 8B, the state in which the transistor 41 is OFF and the transistor 42 is ON as shown in FIG. 8C, and the state in which the transistor 41 is OFF and the transistor 42 is OFF as shown in FIG. 8D. The time during which the state of FIG. 8B is maintained and the time during which the state of FIG. 8D is maintained are each a dead time.

In the state shown in FIG. 8A, since the transistor 41 turns ON, the excitation current going from the output node 43 to the speaker SP flows to the inductor 121, and the parasitic capacitance 41C is discharged, and the parasitic capacitance 42C is charged. Next, when the state is transited to the state shown in FIG. 8B, the current going from the negative power source −VB to the speaker SP via the parasitic capacitance 42C and the inductor 121 flows by the action of the inductor 121. Furthermore, since the parasitic capacitance 42C is discharged by this current, the voltage V43 of the output node 43 lowers.

Next, when the state is transited to the state shown in FIG. 8C, since the transistor 42 turns ON, the excitation current going from the speaker SP to the output node 43 flows to the inductor 121, and the parasitic capacitance 41C is charged, and the parasitic capacitance 42C is discharged. Next, when the state is transited to the state shown in FIG. 8D, the current going from the speaker SP to the positive power source +VB via the inductor 121 and the parasitic capacitance 41 flows by the action of the inductor 121. Furthermore, since the parasitic capacitance 41C is discharged by this current, the voltage V43 of the output node 43 rises.

Figure 9A:
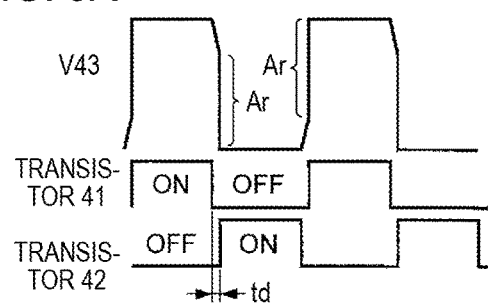
FIGS. 9A and 9B are waveform diagrams explaining the operations attained in the same embodiment.
Figure 9B:
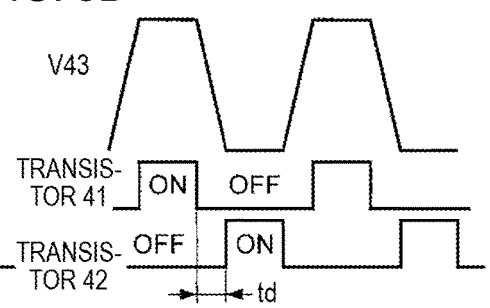

FIGS. 9A and 9B are waveform diagrams showing the transitions of the ON/OFF states of the transistors 41 and 42 and showing the waveforms of the voltage V43 of the output node 43 while the above-mentioned operation is performed.

FIG. 9A shows the operation in the case that the dead time td is shorter than the time required for the inductor 121 to release the electric energy stored in the state shown in FIG. 8A or 8C and complete the voltage transition. In this case, the transistor 41 turns ON before the inductor 121 releases the stored electric energy and the rising of the voltage V43 by the discharge of the parasitic capacitance 41C is completed, and the transistor 42 turns ON before the falling of the voltage V43 by the discharge of the parasitic capacitance 42C is completed. Hence, an area Ar in which the voltage V43 rises at a steep gradient by the switching of the transistor 41 from OFF to ON occurs, an area Af in which the voltage V43 falls at a steep gradient by the switching of the transistor 42 from OFF to ON occurs. In each of these areas Ar and Af, the electric energy $CV^2/2$ (C: the capacitance value of the parasitic capacitance 41C or 42C, V: the charging voltage value of each parasitic capacitance) stored in each of the parasitic capacitance 41C or 42C is consumed by each of the transistors 41 and 42, whereby a switching loss occurs.

FIG. 9B shows the operation in the case that the dead time td is almost coincident with the time required for the inductor 121 to release the electric energy stored in the state shown in FIG. 8A or 8C and complete the voltage transition. In this case, when the transistor 41 or 42 is switched from OFF to ON, the inductor 121 has already finished the release of the electric energy stored in the state shown in FIG. 8A or 8C. Hence, the areas Ar and Af shown in FIG. 9A do not occur.

As clearly shown in FIGS. 8A and 8B, for the purpose of reducing the switching loss of the class D amplifier, it is preferable that the dead time td during which the parasitic capacitances 41C and 42C are charged and discharged by the inductor 121 should be extended to the time required for the completion of the voltage transition. However, if the dead time td is extended, there occurs a problem that the distortion rate of the output signal of the class D amplifier deteriorates. Hence, this embodiment deals with this problem as described below.

First, at the time of no signal or small output, the class D amplifier operates as a separately-excited class D amplifier to prevent the occurrence of a beat; in this case, the switching frequency of the output stage 40 is higher than the switching frequency in the case that the class D amplifier operates as a self-excited class D amplifier. In addition, the deterioration of the distortion rate at the time of no signal or small output is not much of a problem in comparison with the deterioration at the time of large output. Hence, at the time of no signal or small output, as exemplified in FIG. 9B, the dead time td is made almost coincident with the time required for the inductor 121 to release the electric energy stored in the state shown in FIG. 8A or 8C and complete the voltage transition.

In the case of the time other than the time of no signal or small output, as the output of the class D amplifier becomes larger, the deterioration of the distortion rate is liable to occur as the deterioration of sound quality. Hence, in this embodiment, as the output of the class D amplifier becomes larger, the dead time td at the time of the switching of the output stage 40 is shortened gradually.

The dead time control circuit 30D in this embodiment is a circuit provided to attain this kind of operation. The dead time control circuit 30D is a circuit for shortening the dead time td in response to the increase in the output voltage of the full-wave rectification circuit 50.

The dead time control circuit 30D includes the circuit shown in FIG. 10. In FIG. 10, the full-wave rectified voltage V1 output from the full-wave rectification circuit 50 is given to the non-inverting input terminal of an operational amplifier 31. The output signal of the operational amplifier 31 is given to the base of an NPN transistor 32. The emitter of this NPN transistor 32 is connected to the inverting input terminal of the operational amplifier 31 and is grounded via a resistor 33. The above-mentioned circuit which includes the operational amplifier 31, the NPN transistor 32 and the resistor 33 has a function of causing the collector current proportional to the voltage value of the full-wave rectified voltage V1 output from the full-wave rectification circuit 50 to flow to the NPN transistor 32.

The respective emitters of PNP transistors 34a and 34b are connected to a positive power source +VA. The respective bases of the PNP transistors 34a and 34b and the collector of the PNP transistor 34a are connected to the collector of the NPN transistor 32. The PNP transistors 34a and 34b constitute a current mirror circuit for causing a collector current proportional to the collector current of the NPN transistor 32 to flow to the PNP transistor 34b.

A capacitor 35 is interposed between the collector of the PNP transistor 34b and the grounding wire. An N-channel transistor 36 is connected in parallel with the capacitor 35. The signal obtained by inverting the output voltage V20 of the comparator 20 is input to the gate of this transistor 36. A buffer 38 binarizes the charging voltage V35 of the capacitor 35 and outputs the obtained signal as a signal V38.

FIGS. 11A to 11D are waveform diagrams showing the waveforms at the respective sections of the circuit shown in FIG. 10. FIG. 11A shows the waveform of the output voltage V20 of the comparator 20. In the circuit shown in FIG. 10, since the transistor 36 is ON while the signal V20 has an L level, the charging voltage V35 of the capacitor 35 becomes 0 V. After that, when the level of the signal V20 is changed from the L level to an H level, the transistor 36 turns OFF, and the capacitor 35 is charged by the collector current of the PNP transistor 34b.

FIGS. 11B and 11C respectively exemplify the waveforms of the charging voltage V35 of the capacitor 35. The collector current of the PNP transistor 34b becomes larger as the voltage value of the full-wave rectified voltage V1 output from the full-wave rectification circuit 50 becomes larger. Hence, the gradient of the charging voltage V35 at the time when the level of the signal V20 has been changed from the L level to the H level becomes steeper as the voltage value of the full-wave rectified voltage V1 becomes larger. In the examples shown in FIGS. 11B and 11C, the voltage value of the full-wave rectified voltage V1 in FIG. 11C is larger than the voltage value of the full-wave rectified voltage V1 in FIG. 11B. Hence, the charging voltage V35 of the capacitor 35 shown in FIG. 11C rises at a gradient steeper than that of the charging voltage V35 of the capacitor 35 shown in FIG. 11B.

When the charging voltage V35 of the capacitor 35 exceeds the threshold voltage Vtha of the buffer 38, the output signal V38 rises from an L level to an H level. Hence, the signal V38 has a waveform having a rising edge that is delayed with respect to the rising edge of the signal V20 by a certain time.

FIG. 11D shows the waveforms of the output signal V38 of the buffer 38 in the case that the charging voltage V35 shown in FIG. 11B is input and in the case that the charging voltage V35 shown in FIG. 11C is input. As already described, the gradient of the rising of the charging voltage V35 shown in FIG. 11C is steeper than the gradient of the rising of the charging voltage V35 shown in FIG. 11B. Hence, the delay time from the rising edge of the signal V20 to the rising edge of the signal V38 in the case that the charging voltage V35 shown in FIG. 11C is given to the buffer 38 becomes shorter than the delay time from the rising edge of the signal V20 to the rising edge of the signal V38 in the case that the charging voltage V35 shown in FIG. 11B is given.

When the signal V20 falls from the H level to the L level, since the transistor 36 turns ON, the charging voltage V35 of the capacitor 35 becomes 0 V as shown in FIGS. 11B and 11C. Hence, the output signal of the buffer 38 lowers from the H level to the L level as shown in FIG. 11D. As a result, the signal V38 becomes a signal that falls together with the lowering edge of the signal V20.

As described above, the signal V38 becomes a signal that rises being delayed with respect to the rising edge of the signal V20 by a certain time and falls together with the falling edge of the signal V20. In the gate driver circuit 30 at the post stage of the dead time control circuit 30D, a gate signal for turning ON the transistor 41 of the output stage 40 is generated on the basis of the signal V38.

Furthermore, the dead time control circuit 30D includes a circuit, not shown, having a circuit configuration similar to that shown in FIG. 10 and outputting a signal (temporarily referred to as a signal V38') that rises being delayed with respect to the falling edge of the signal V20 by a certain time and falls together with the rising edge of the signal V20. In the gate driver circuit 30 at the post stage of the dead time control circuit 30D, a gate signal for turning ON the transistor 42 of the output stage 40 is generated on the basis of this signal V38'.

Moreover, in this embodiment, each of the delay time from the rising edge of the signal V20 to the rising edge of the signal V38 and the delay time from the falling edge of the signal V20 to the rising edge of the signal V38' becomes the dead time td.

As obvious from the explanations referring to FIGS. 11A to 11D, in this embodiment, as the voltage value of the full-wave rectified voltage V1 output from the full-wave rectification circuit 50 becomes larger, the gradient of the charging voltage V35 of the capacitor 35 becomes larger and the dead time td becomes shorter. Hence, with this embodiment, the dead time td is set to a sufficient length at the time of no signal or small output to reduce the switching loss of the output stage 40, and the dead time td is made shorter as the class D amplifier 1D generates larger output to improve the distortion rate, whereby the deterioration of sound quality due to distortion can be prevented.

Other Embodiments

Although the first to fifth embodiments of this disclosure have been described above, other embodiments can be conceived from this disclosure. For example, the following embodiments are conceivable.

(1) In each of the above-mentioned embodiments, although the output stage 40 is configured by MOS FETs, the output stage 40 may be configured by bipolar transistors.

(2) In each of the above-mentioned embodiments, the positive power source +VB is provided as a high potential power source and the negative power source −VB is provided as a low potential power source for the output stage 40. However, the high potential power source and the low potential power source may be power sources having the same polarity.

(3) In each of the above-mentioned embodiments, the full-wave rectification circuit 50 and the averaging circuit 60, 60B or 60C for making the full-wave rectified voltage V1 uniform on a time axis and generating a DC voltage is used as a reference signal generator. However, a half-wave rectification circuit may be used instead of the full-wave rectification circuit 50. Furthermore, in each of the above-mentioned embodiments, although the DC voltage is generated as the reference signal, it may be possible that a DC current indicating the driving amount for the load at the output stage 40 is generated as a reference signal and that the switching of the standard signal is performed by comparing this DC current with the threshold value.

(4) In the above-mentioned third and fourth embodiments, it may be possible that the class D amplifier is provided with a time constant setting section for setting the time constant of the averaging circuit by using variable resistors as the resistors R1 and R2 of the averaging circuit serving as a time constant circuit and by setting the resistance values of the respective variable resistors according to the operation performed by the user. With this embodiment, the response characteristics in the time region for the switching of the standard signal with respect to the change in the levels of the drive signal of the speaker SP and the input audio signal AIN can be switched by the operation performed by the user.

(5) In each of the above-mentioned embodiments, it may be possible that the class D amplifier is provided with a threshold value setting section for setting the threshold voltage Vth to be compared with the output voltage of the averaging circuit according to the operation performed by the user. With this embodiment, it may be possible that the volume of the speaker depending on which self-excited oscillation is switched to separately-excited oscillation can be changed by the operation of the operation section.

(6) In the above-mentioned third and fourth embodiments, each of the time constants of the averaging circuit 60B and the averaging circuit 60C is set to a time constant to the extent that the output signal of each averaging circuit pulsates in response to each wave of the drive signal of the speaker SP (see FIGS. 4 and 6). However, the averaging circuits 60B and 60C are not limited to an averaging circuit having such a short time constant and capable of performing high speed response, but may be an averaging circuit having a time constant of, for example, approximately several ten milliseconds to several seconds. Furthermore, the time constant of the averaging circuit may be switched between time constants being extraordinarily different from each other depending on the operation of the operation section, for example, 125 msec in FAST mode and 1 sec in SLOW mode.

(7) In each of the above-mentioned embodiments, a half bridge having a single high-side switching device and a single low-side switching device is provided as the output stage 40. However, instead of this kind of half bridge, a full bridge which has a first high-side switching device, a first low-side switching device, a second high-side switching device and a second low-side switching device and in which a speaker and a filter are interposed between the common connection point of the first high-side switching device and the first low-side switching device and the common connection point of the second high-side switching device and the second low-side switching device may be provided as the output stage 40.

(8) In each of the above-mentioned embodiments, the feedback circuit 100 interposed between the output node 43 of the output stage 40 and the integration amplifier 10 includes the first-order integrator having the resistor 101 and the capacitor 103. In the case that the self-excited oscillation conditions of the class D amplifier are satisfied, the first-order integrator having the resistor 101 and the capacitor 103 may be moved to the post stage of the integration amplifier 10, for example, as in the class D amplifier 1E shown in FIG. 12.

(9) In the above-mentioned fifth embodiment, although the dead time td is controlled on the basis of the full-wave rectified voltage V1 of the drive signal to be given to the speaker SP, instead of the full-wave rectified voltage V1 of the drive signal to be given to the speaker SP, the full-wave rectified voltage of the input audio signal AIN may be used to control the dead time td.

The embodiments of this disclosure will herein be summarized as described below.

(1) The class D amplifier of this disclosure includes: an output stage configured to perform a switching operation; a feedback circuit configured to generate a feedback signal based on the output signal output from the output stage; an integration amplifier configured to output an integrated value signal in response to an input signal and the feedback signal; a comparator configured to compare the integrated value signal with a standard signal; a driver configured to control the output stage based on a signal output from the comparator; a carrier signal generator configured to generate a carrier signal having a predetermined frequency; a reference signal generator configured to output a reference signal indicating a driving amount for a load at the output stage; and a standard signal switch configured to switch the standard signal to the carrier signal or a standard potential based on whether a level of the reference signal is smaller than a threshold value.

(2) In the class D amplifier set forth in the above-mentioned item (1), the reference signal generator outputs the reference signal based on the input signal.

(3) In the class D amplifier set forth in the above-mentioned item (1) or (2), the reference signal generator has a time constant setting portion configured to set a time constant of the reference signal.

(4) In the class D amplifier set forth in any one of the above-mentioned items (1) to (3), the standard signal switch has a threshold value setting portion configured to set the threshold value.

(5) In the class D amplifier set forth in any one of the above-mentioned items (1) to (4), the output stage has a plurality of switching devices connected to an output node of the output stage, the driver switches the plurality of switching devices ON and OFF while a dead time during which all of the plurality of switching devices are turned OFF is inserted between the switching of ON and OFF of the plurality of switching devices, and the driver has a dead time controlling portion configured to control a duration of the dead time based on the drive signal applied from the output stage to the load or the input signal.

With this disclosure, the class D amplifier operates as a separately-excited class D amplifier at the time of no signal or small output, thereby being capable of preventing the occurrence of a beat, and operates as a self-excited class D amplifier at the time of large output, thereby being capable of reducing switching loss and improving efficiency by lowering the oscillation frequency and being capable of enhancing audio performance by reducing the distortion rate, whereby the class D amplifier is useful.

What is claimed is:

1. A class D amplifier comprising:
    an output stage configured to perform a switching operation;
    a feedback circuit configured to generate a feedback signal based on the output signal output from the output stage;
    an integration amplifier configured to output an integrated value signal in response to an input signal and the feedback signal;
    a comparator configured to compare the integrated value signal with a standard signal;
    a driver configured to control the output stage based on a signal output from the comparator;
    a carrier signal generator configured to generate a carrier signal having a predetermined frequency;
    a reference signal generator configured to output a reference signal indicating a driving amount for a load at the output stage; and
    a standard signal switch configured to switch the standard signal to the carrier signal or a standard potential based on whether a level of the reference signal is smaller than a threshold value.

2. The class D amplifier according to claim 1, wherein the reference signal generator outputs the reference signal based on the input signal.

3. The class D amplifier according to claim 1, wherein the reference signal generator has a time constant setting portion configured to set a time constant of the reference signal.

4. The class D amplifier according to claim 1, wherein the standard signal switch is configured to set the threshold value.

5. The class D amplifier according to claim 1, wherein:
    the output stage has a plurality of switching devices connected to an output node of the output stage;
    the driver switches the plurality of switching devices ON and OFF while a dead time during which all of the plurality of switching devices are turned OFF is inserted between the switching of ON and OFF of the plurality of switching devices; and
    the driver has a dead time controlling portion configured to control a duration of the dead time based on a drive signal applied from the output stage to the load or the input signal.

* * * * *